United States Patent
Lee et al.

(10) Patent No.: US 12,540,395 B2
(45) Date of Patent: Feb. 3, 2026

(54) THIN FILM DEPOSITION METHOD AND METHOD OF FABRICATING ELECTRONIC DEVICE USING THE SAME

(71) Applicants: SK hynix Inc., Icheon (KR); INCHEON NATIONAL UNIVERSITY RESEARCH & BUSINESS FOUNDATION, Incheon (KR)

(72) Inventors: Do Han Lee, Icheon (KR); Eun Soo Kim, Icheon (KR); Seung Wook Ryu, Icheon (KR); Tae Hwan Lim, Icheon (KR); Han-Bo-Ram Lee, Incheon (KR); Abu Saad Aqueel Ahmad Ansari, Incheon (KR); Ngoc Le Trinh, Incheon (KR)

(73) Assignees: SK hynix Inc., Icheon (KR); INCHEON NATIONAL UNIVERSITY RESEARCH & BUSINESS FOUNDATION, Icheon (KR)

( * ) Notice: Subject to any disclaimer, the term of this patent is extended or adjusted under 35 U.S.C. 154(b) by 441 days.

(21) Appl. No.: 18/155,549

(22) Filed: Jan. 17, 2023

(65) Prior Publication Data
US 2023/0227972 A1 Jul. 20, 2023

(30) Foreign Application Priority Data
Jan. 19, 2022 (KR) .................. 10-2022-0007800

(51) Int. Cl.
*C23C 16/455* (2006.01)
*C23C 16/04* (2006.01)
(Continued)

(52) U.S. Cl.
CPC ...... *C23C 16/45534* (2013.01); *C23C 16/045* (2013.01); *H01L 21/76877* (2013.01); *H10B 41/27* (2023.02); *H10B 43/27* (2023.02)

(58) Field of Classification Search
CPC . C23C 16/45534; C23C 16/045; C23C 16/18; C23C 16/45553; C23C 16/06;
(Continued)

(56) References Cited

U.S. PATENT DOCUMENTS 9,812,320 B1 * 11/2017 Pore .................. C23C 16/45534
9,966,299 B2 * 5/2018 Tang ................. C23C 16/45527
(Continued)

FOREIGN PATENT DOCUMENTS

KR  1020030090872 A  12/2003
KR  1020210021100 A   2/2021

*Primary Examiner* — Mohammed Shamsuzzaman

(57) ABSTRACT

A thin film deposition method and a method of fabricating an electronic device using the same are disclosed. The thin film deposition method may include preparing a substrate structure having a pattern portion including a hole, adsorbing a reaction inhibitor to inside and outside of the hole in the substrate structure, wherein an adsorption density of the reaction inhibitor may be lower in the inside than the outside, and depositing a metal layer on the inside and outside the hole by an atomic layer deposition (ALD) process, wherein a deposition rate of the depositing may vary depending on regions by the reaction inhibitor, and wherein the reaction inhibitor may include a metal atom and a ligand for reaction inhibition bonded to the metal atom, and the metal atom may remain on the substrate structure in the depositing the metal layer.

11 Claims, 13 Drawing Sheets

(51) Int. Cl.
*H01L 21/768* (2006.01)
*H10B 41/27* (2023.01)
*H10B 43/27* (2023.01)

(58) Field of Classification Search
CPC ......... H01L 21/76877; H01L 21/28556; H01L 21/28562; H10B 41/27; H10B 43/27; H10B 41/20; H10B 41/35; H10B 43/20; H10B 43/35
See application file for complete search history.

(56) References Cited

U.S. PATENT DOCUMENTS

| | | | |
|---|---|---|---|
| 11,355,338 B2 * | 6/2022 | Ueda | H01L 21/02126 |
| 11,584,986 B1 * | 2/2023 | Abelson | H01L 21/28562 |
| 11,996,292 B2 * | 5/2024 | Bhatnagar | H01L 21/28556 |
| 2007/0269982 A1 * | 11/2007 | Rocklein | H01L 21/28556 257/E21.585 |
| 2015/0243545 A1 * | 8/2015 | Tang | H01L 21/76837 118/704 |
| 2016/0148800 A1 * | 5/2016 | Henri | C23C 16/45534 438/503 |
| 2020/0279757 A1 * | 9/2020 | Kumakura | C23C 16/0227 |
| 2020/0357631 A1 * | 11/2020 | Ueda | C23C 16/45542 |
| 2021/0125832 A1 * | 4/2021 | Bhatnagar | H01L 21/28562 |
| 2021/0398780 A1 * | 12/2021 | Lavoie | H01J 37/32165 |
| 2021/0407795 A1 * | 12/2021 | Kim | H01L 21/02274 |
| 2022/0119939 A1 * | 4/2022 | Noh | H01L 21/02271 |
| 2022/0230870 A1 * | 7/2022 | Hashimoto | H01L 21/0228 |
| 2022/0380897 A1 * | 12/2022 | Bhatnagar | C23C 16/14 |
| 2023/0070312 A1 * | 3/2023 | Cho | H01L 21/32 |
| 2023/0175117 A1 * | 6/2023 | Austin | H01L 21/02323 118/715 |
| 2023/0175129 A1 * | 6/2023 | Winkler | C23C 16/08 438/758 |
| 2023/0268184 A1 * | 8/2023 | Lee | C23C 16/0272 438/584 |
| 2023/0307290 A1 * | 9/2023 | Abel | C23C 16/0245 |
| 2025/0069948 A1 * | 2/2025 | Mandia | H01L 21/76879 |

\* cited by examiner

THIN FILM DEPOSITION METHOD AND METHOD OF FABRICATING ELECTRONIC DEVICE USING THE SAME

CROSS-REFERENCES TO RELATED APPLICATION

The present application claims, under 35 U.S.C. § 119(a), the benefit of Korean application No. 10-2022-0007800, filed on Jan. 19, 2022 which is herein incorporated by reference in its entirety.

BACKGROUND OF THE INVENTION

1. Field

Embodiments of the present disclosure relate to a material deposition method and a method of fabricating a device using the same, and more particularly, to a thin film deposition method using an atomic layer deposition (ALD) process and a method of fabricating an electronic device using the same.

2. Description of the Related Art

As the degree of integration of various electronic devices including semiconductor devices continues to increase and patterns are getting finer and finer, various limitations and problems may occur in the thin film deposition process according to the prior art. For example, with the high integration of memory devices, an aspect ratio and the number of stacking stages of a three-dimensional vertical NAND (i.e., V-NAND) device are increasing, and at the same time, the tier size is decreasing in a vertical direction. Accordingly, during a process of filling vias and trenches, that is, a pattern filling process, defects such as voids and seams may be formed.

In particular, a metal used as an electrode material in a three-dimensional V-NAND device (e.g., NAND flash device), for example, tungsten, may form voids or seams in a plug due to non-uniform deposition behavior, thereby increasing resistance of the plug. When a metal film is deposited on a via or a trench structure by a general thin film deposition method, more deposition occurs at the entrance (or inlet) and top of the via or the trench structure due to the geometrical shape or surface energy difference in various regions. Furthermore, a void and a seam are formed inside the via or the trench structure, which causes a decrease in conductivity and various problems due to a decrease in a conductive area. In addition, when a metal film is deposited by an atomic layer deposition method, gas may remain inside a void or a seam, and the residual gas may damage an underlying structure, for example, a substrate portion, or may cause various problems due to diffusion of impurities trapped in the void or the seam.

Therefore, thin film deposition technology, which may overcome the limitations of the conventional thin film deposition method, effectively suppress the occurrence of defects such as voids and seams with respect to a substrate structure having a fine pattern, and secure excellent thin film properties, is required.

SUMMARY OF THE INVENTION

The technological object to be achieved by the present invention is to provide a thin film deposition method capable of overcoming the limitations and problems of the conventional thin film deposition method, effectively suppressing the occurrence of defects such as voids or seams for a substrate structure having a predetermined pattern structure, and securing excellent physical properties of a thin film.

In addition, the technological object to be achieved by the present invention is to provide a method of fabricating an electronic device to which the above-described thin film deposition method is applied.

In addition, the technological object to be achieved by the present invention is to provide a reaction inhibitor material which may be applied to the above-described thin film deposition method and the above-described method of fabricating an electronic device.

The objects to be achieved by the present invention are not limited to the above-mentioned problems, and other objects not mentioned will be understood by those skilled in the art from the following description.

According to one embodiment of the present invention, there is provided a thin film deposition method comprising: preparing a substrate structure having a pattern portion including a hole; adsorbing a reaction inhibitor to inside and outside of the hole in the substrate structure, wherein an adsorption density of the reaction inhibitor is lower in the inside than the outside; and depositing a metal layer on the inside and outside the hole by an atomic layer deposition (ALD) process, wherein a deposition rate of the depositing varies depending on regions by the reaction inhibitor, and wherein the reaction inhibitor includes a metal atom and a ligand for reaction inhibition bonded to the metal atom, and the metal atom remains on the substrate structure in the depositing the metal layer.

The metal atom of the reaction inhibitor may be the same atom as a metal atom of the metal layer.

The adsorption density of the reaction inhibitor may decrease from an entrance portion of the hole toward a bottom portion of the hole.

The reaction inhibitor may include any one of $C_{10}H_{12}M$ (where M is a metal atom) and $C_9H_8O_3M$ (where M is a metal atom).

The $C_{10}H_{12}M$ may be $C_{10}H_{12}W$ or $C_{10}H_{12}Ti$.

The $C_9H_8O_3M$ may be $C_9H_8O_3W$ or $C_9H_8O_3Ti$.

The reaction inhibitor may be a first reaction inhibitor, and the thin film deposition method may further include adsorbing a second reaction inhibitor onto the substrate structure one or more times while the depositing the metal layer.

The second reaction inhibitor may be the same material as the first reaction inhibitor.

The reaction inhibitor may be a first reaction inhibitor, and the depositing the metal layer may include depositing a first metal layer and depositing a second metal layer on the first metal layer, and the thin film deposition method may further include adsorbing a second reaction inhibitor on the first metal layer between the depositing the first metal layer and the depositing the second metal layer.

The depositing of the metal layer may include: a first supplying step for supplying a precursor gas including a metal precursor into a chamber in which the substrate structure is provided; a first purge step for purging the chamber; a second supplying step for supplying a reactant gas into the chamber; and a second purge step for purging the chamber.

The hole may have a vertical hole structure.

The hole may have a horizontal hole structure.

A plurality of first holes extending in a horizontal direction along a first side surface of the substrate structure may be formed to be spaced apart from each other in a vertical direction, a plurality of second holes extending in a horizontal direction along a second side surface facing the first side surface of the substrate structure may be formed to be spaced apart from each other in a vertical direction, and the metal layer may be deposited in the plurality of first holes and the plurality of second holes.

According to another embodiment of the present invention, there is provided a method of fabricating an electronic device, the method comprising: preparing a substrate structure having a pattern portion including a hole; and depositing a metal layer on the substrate structure by using the above-described thin film deposition method.

The electronic device may include a three-dimensional V-NAND device.

According to another embodiment of the present invention, there is provided a reaction inhibitor which is adsorbed to a given region of a substrate in an atomic layer deposition (ALD) process to inhibit a reaction for thin film deposition, the reaction inhibitor comprising a metal atom and a ligand for reaction inhibition bonded to the metal atom.

The reaction inhibitor may include any one of $C_{10}H_{12}M$ (where M is a metal atom) and $C_9H_8O_3M$ (where M is a metal atom).

The $C_{10}H_{12}M$ may be $C_{10}H_{12}W$ or $C_{10}H_{12}Ti$.

The $C_9H_8O_3M$ may be $C_9H_8O_3W$ or $C_9H_8O_3Ti$.

The thin film formed by the ALD process may be a metal layer, and the metal atom of the reaction inhibitor may be the same as a metal atom of the metal layer.

According to embodiments of the present invention, a reaction inhibitor including a metal atom and a ligand for reaction inhibition bonded to the metal atom may be deposited at different densities depending on positions on the surface of the pattern on which the metal thin film is to be formed, and then, the metal thin film may be formed. Therefore, it is possible to implement a thin film deposition method which may overcome the limitations and problems of the conventional thin film deposition method, effectively suppress the occurrence of defects such as voids and seams for the substrate structure having a predetermined pattern structure, and secure excellent properties of the deposited thin film. The thin film deposition method according to the embodiments of the present invention may be usefully applied to fabricating of various electronic devices.

In addition, according to embodiments of the present invention, a reaction inhibitor which may be applied to the above-described thin film deposition method may be provided. Since the reaction inhibitor according to the embodiments may include the same material as a target material to be deposited, deterioration of physical properties of the deposited thin film may be prevented and may advantageously act in securing excellent thin film properties.

DETAILED DESCRIPTION OF THE INVENTION

Figure 1A:
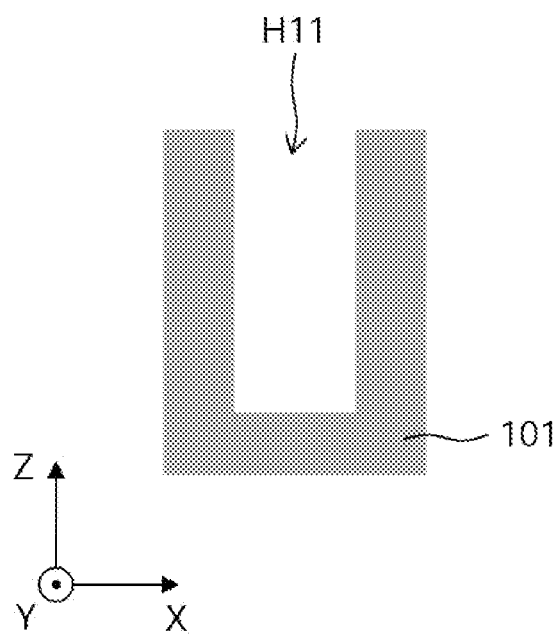
FIG. 1A to FIG. 1D illustrate a thin film deposition method according to an embodiment of the present disclosure.

Hereinafter, the embodiments of the present disclosure will be described in detail with reference to the accompanying drawings.

The embodiments of the present disclosure to be described below are provided to more clearly explain the present invention to those having common knowledge in the related art, and the scope of the present invention is not limited by the following embodiments. The following embodiment may be modified in many different forms.

The terminology used herein is used to describe specific embodiments, and is not used to limit the present invention. As used herein, terms in the singular form may include the plural form unless the context clearly dictates otherwise. Also, as used herein, the terms "comprise" and/or "comprising" specifies presence of the stated shape, step, number, action, member, element and/or group thereof; and does not exclude presence or addition of one or more other shapes, steps, numbers, actions, members, elements, and/or groups thereof. In addition, the term "connection" as used herein is a concept that includes not only that certain members are directly connected, but also a concept that other members are further interposed between the members to be indirectly connected.

In addition, in the present specification, when a member is said to be located "on" another member, this includes not only a case in which a member is in contact with another member but also a case in which another member is present between the two members. As used herein, the term "and/or" includes any one and any combination of one or more of those listed items. In addition, as used herein, terms such as "about", "substantially", etc. are used as a range of the numerical value or degree, in consideration of inherent fabricating and material tolerances, or as a meaning close to the range. Furthermore, accurate or absolute numbers provided to aid the understanding of the present application are used to prevent an infringer from using the disclosed present invention unfairly.

Hereinafter, the embodiments of the present disclosure will be described in detail with reference to the accompanying drawings. The size or the thickness of the regions or the parts illustrated in the accompanying drawings may be slightly exaggerated for clarity and convenience of description. The same reference numerals refer to the same elements throughout the detailed description.

FIG. 1A to FIG. 1D illustrate a thin film deposition method according to an embodiment of the present disclosure. The thin film deposition method may be performed on a substate structure 101 having a pattern including a hole H11.

Referring to FIG. 1A, the substrate structure 101 having the pattern including the hole H11 may be prepared. Here, the hole H11 may be formed in a substrate, and may be formed to extend in a direction perpendicular to an upper (or top) surface of the substrate. In other words, the hole H11 may have a vertical structure (or vertical hole structure) or a substantially vertical structure. The hole H11 may be a circular hole or a square hole. That is, a plan view of the hole H12 corresponding to a plane of X-Y axes may have a circular or square shape. When the hole H11 is the square hole, the hole H11 may have the square shape on the plane of X-Y axes in the drawing. The hole H11 may be a kind of trench, and in some cases, may have a via structure. It may be understood that a 'hole' may have any of various shapes and structures in the present disclosure. the substrate structure 101 may have an uneven pattern formed by the hole H11.

Figure 1B:
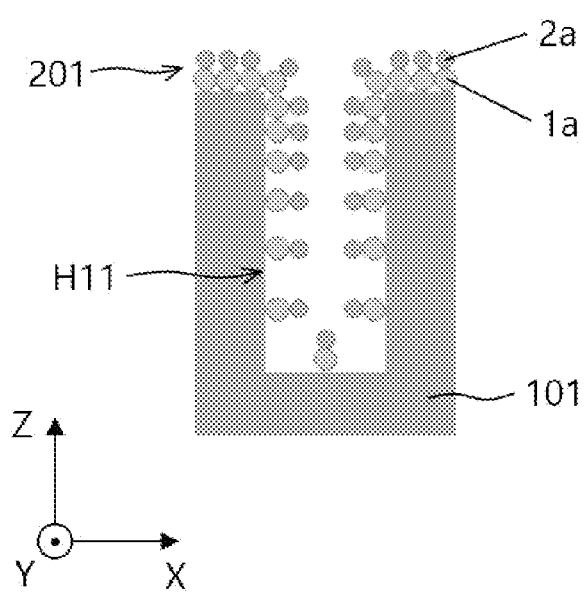

Referring to FIG. 1B, a reaction inhibitor 201 may be adsorbed to an exposed surface of the substrate structure 101 including the hole H11. In other words, the reaction inhibitor 201 may be adsorbed to the inside and the outside of the hole H11, and the outside of the hole H11 corresponds to an upper surface portion of the substrate structure 101) where the hole H11 is not formed. The reaction inhibitor 201 may be formed as a single molecular layer.

The reaction inhibitor 201 may be adsorbed so that an adsorption density at the inside of the hole H11 may be lower than that at the outside of the hole H11. That is, the adsorption density (an average density) of the reaction inhibitor 201 inside the hole H11 may be lower than the adsorption density (an average density) of the reaction inhibitor 201 outside the hole H11. More preferably, the adsorption density of the reaction inhibitor 201 may decrease from an entrance (or inlet) portion of the hole H11 and a peripheral portion thereof toward a bottom portion of the hole H11. In the hole H11, the entrance portion represents a portion connected to the upper surface portion of the substrate structure 101, the peripheral portion represents a portion corresponding to a side surface of the hole H11 except for the entrance portion, and the bottom portion represents a portion corresponding to a bottom surface of the hole H11.

When the reaction inhibitor 201 is adsorbed by using a geometrical shadowing effect of a pattern such as the hole H11 or by controlling characteristics of a gas flow, the reaction inhibitor 201 may be adsorbed to the entrance portion of the hole H11 and its periphery at a relatively high density, and the adsorption density can be decreased toward the bottom portion of the hole H11. Because of the varying adsorption density of the reaction inhibitor 201, when depositing subsequent metal layers (e.g., a metal layer 301' in FIG. 1C and a metal layer 301 in FIG. 1D), deposition rates of the subsequent metal layers may vary depending on the above portions of the hole H11.

The reaction inhibitor 201 used in the embodiment of the present disclosure may include a compound that includes a metal atom 1a and a reaction inhibition ligand 2a bonded to the metal atom 1a. The metal atom 1a of the reaction inhibitor 201 may be the same as a metal atom of a metal layer to be formed or an atom having similar physical properties to the metal layer. The reaction inhibition ligand 2a is a part that substantially performs a reaction inhibitory function, and may have an organic molecular structure. Accordingly, the reaction inhibition ligand 2a may be an organic ligand. The configuration of the reaction inhibitor 201 will be described in more detail later.

Figure 1C:
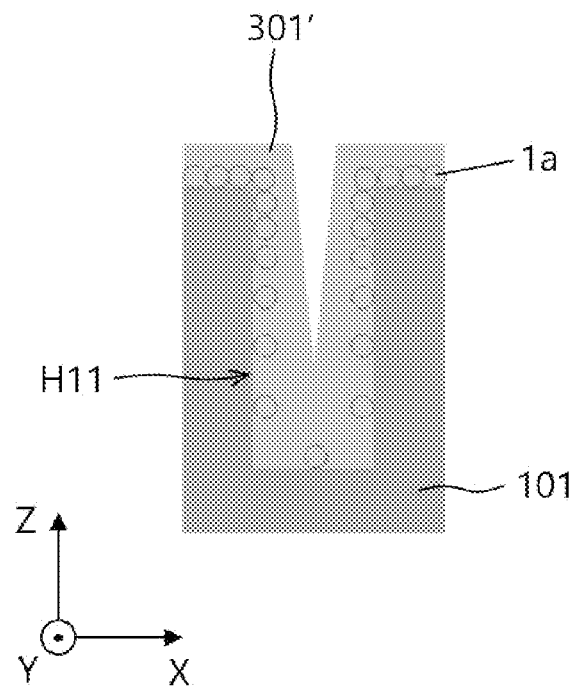
Figure 1D:
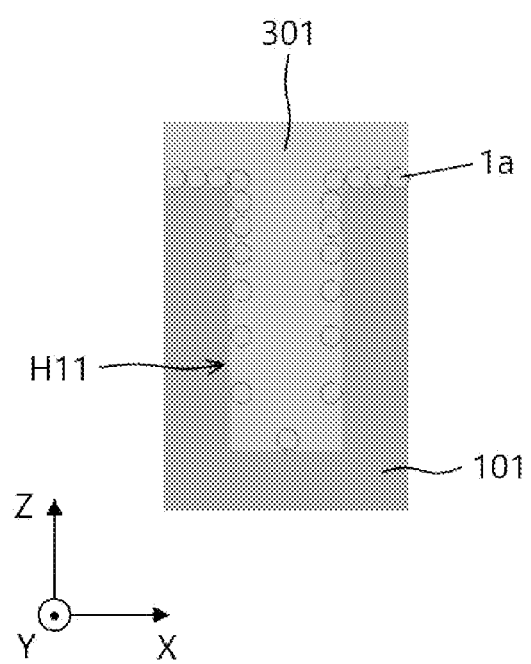

Referring to FIG. 1C and FIG. 1D, the metal layer 301' and the metal layer 301 may be deposited on the inside and the outside of the hole H11 by performing an atomic layer deposition (ALD) process. The metal layer 301' of FIG. 1C represents a metal layer formed in an intermediate stage in which a gap filling process is not completed, and the metal layer 301 of FIG. 1D represents a metal layer formed in a state in which the gap filling process is substantially completed. Accordingly, the metal layer 301 may include the metal layer 301'.

When depositing a thin film, e.g., the metal layer 301, according to the ALD process, a deposition rate of the metal layer 301 may vary depending on the portions of the hole H11 to which the reaction inhibitor 201 is adsorbed. In other words, the deposition rate of the metal layer 301 may vary according to the adsorption density of the reaction inhibitor 201. The deposition rate of the metal layer 301 may be relatively low at the entrance portion of the hole H11 and an upper peripheral portion thereof which have a relatively high adsorption density of the reaction inhibitor 201, and the deposition rate of the metal layer 301 may be relatively high at the bottom portion of the hole H11 and a lower peripheral portion thereof which have a relatively low adsorption density of the reaction inhibitor 201. Therefore, according to the embodiment of the present disclosure, an overhang phenomenon at the entrance portion of the hole H11 may be prevented, and conformal deposition may be achieved through the entrance portion of the hole H11 and the bottom portion of the hole H11. Therefore, gap filling characteristics of the metal layer 301 may be improved, and the occurrence of defects such as voids and seams in the metal layer 301 may be prevented.

According to the embodiment of the present disclosure, in the step of depositing the metal layer 301, the metal atoms 1a of the reaction inhibitor 201 may remain on the exposed surface of the substrate structure 101. Since the metal atom 1a of the reaction inhibitor 201 may be the same as a target material, e.g., the metal atom of the metal layer 301 to be deposited or an atom having similar physical properties to the metal atom of the metal layer 301, even if it remains in contact with the metal layer 301 on the substrate structure 101, it may improve or maintain properties, such as physical and electrical properties, of the metal layer 301 without acting as an impurity. Since the reaction inhibitor 201 includes the metal atom 1a, it may also act as a precursor for the formation of the metal layer 301.

Meanwhile, in the step of depositing the metal layer 301, all or most of the ligands 2a of the reaction inhibitor 201 may be separated from the metal atoms 1a, and may be removed from the substrate structure 101. The reaction ligand 2a of the reaction inhibitor 201 may have an excellent reaction inhibition function at an initial stage of the deposition of the metal layer 301, but as a deposition cycle (i.e., an ALD cycle) for depositing the metal layer 301 is repeatedly performed, the reaction ligands 2a may be gradually removed from the substrate structure 101 and thus the reaction inhibition characteristics of the reaction inhibitor 201 may be gradually reduced. Since the reaction ligands 2a of the reaction inhibitor 201 may be removed from the substrate structure 101, the characteristics of the metal layer 301 may be further improved. According to the embodiment of the present disclosure, when the deposition cycle (i.e., the ALD cycle) for depositing the metal layer 301 is repeatedly performed, even if the reaction inhibitory property of the reaction inhibitor 201 is gradually reduced, the overhang problem is prevented. Therefore, excellent gap filling characteristics may be secured until the deposition of the metal layer 301 is completed.

FIG. 2A to FIG. 2D illustrate a thin film deposition method according to another embodiment of the present invention. The thin film deposition method may be performed on a substrate structure 102 having a pattern including a hole H12.

Figure 2A:
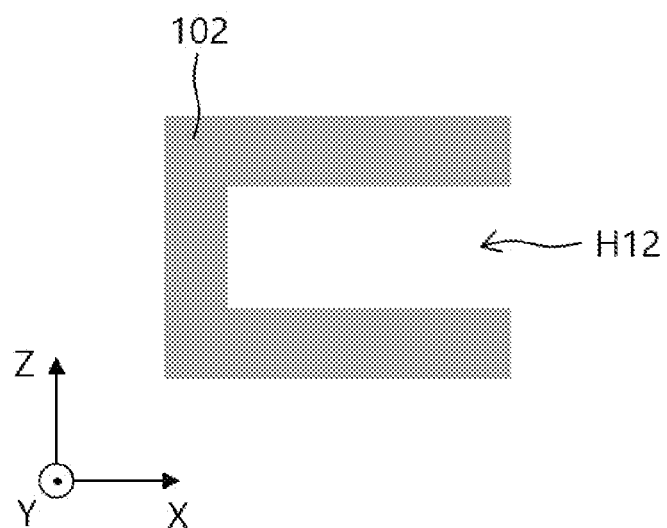
FIG. 2A to FIG. 2D illustrate a thin film deposition method according to another embodiment of the present disclosure.

Referring to FIG. 2A, the substrate structure 102 having the pattern including the hole H12 may be prepared. Here, the hole H12 may be formed on a lateral side (i.e., a side surface portion) of a substrate, and may be formed to extend in a direction parallel to an upper (or top) surface of the substrate. That is, the hole H12 may have a horizontal structure (or horizontal hole structure) or a substantially horizontal structure. The hole H12 may be a circular hole or a square hole. That is, a cross-sectional view of the hole H12 corresponding to a plane of Y-Z axes may have a circular or square shape. When the hole H12 is the square hole, the hole H12 may have the square shape on the plane of Y-Z axes in the drawing. The hole H12 may be a kind of trench, and in some cases, may have a via structure.

Figure 2B:
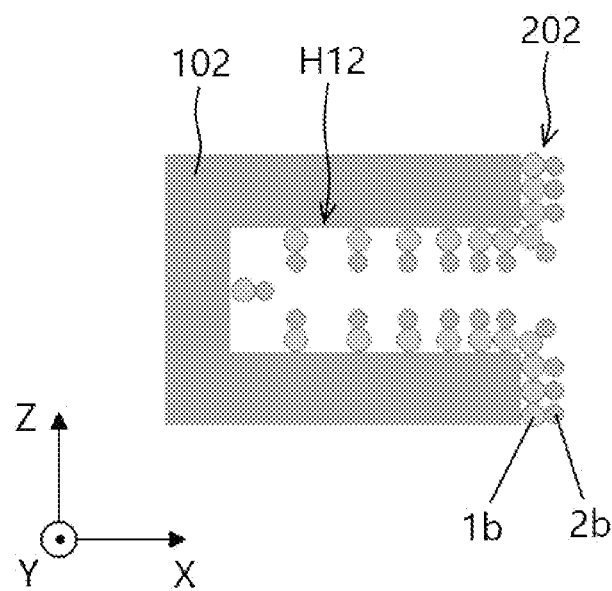

Referring to FIG. 2B, a reaction inhibitor 202 may be adsorbed to an exposed surface the substrate structure 102, i.e., the inside and outside of the hole H12. The reaction inhibitor 202 may be adsorbed to the inside of the hole H12 and a side surface portion of the substrate structure 102 except for a portion corresponding to the hole H12. The reaction inhibitor 202 may be adsorbed so that an adsorption density at the inside of the hole H12 may be lower than that at the outside of the hole H12. In other words, the adsorption density (an average density) of the reaction inhibitor 202 inside the hole H12 may be lower than the adsorption density (an average density) of the reaction inhibitor 202 outside the hole H12. More preferably, the adsorption density of the reaction inhibitor 202 may decrease from an entrance (or inlet) portion of the hole H12 and a peripheral portion thereof toward a bottom portion of the hole H12. When rotating the hole H12 shown in FIG. 2A in a counterclockwise direction by 90 degrees, the entrance portion represents a portion connected to the side surface portion of the substrate structure 102, the peripheral portion represents a portion corresponding to a side surface of the rotated hole H12 except for the entrance portion, and the bottom portion represents a portion corresponding to a bottom surface of the rotated hole H12.

The reaction inhibitor 202 may include a metal atom 1b and a reaction inhibition ligand 2b bonded to the metal atom 1b. The metal atom 1b of the reaction inhibitor 202 may be the same as a metal atom of a metal layer to be formed (e.g., a metal layer 302' in FIG. 2C and a metal layer 302 in FIG. 2D) or an atom having similar physical properties to the metal atom of the metal layer. The reaction inhibition ligand 2b is a part that substantially performs a reaction inhibitory function, and may have an organic molecular structure. The reaction inhibition ligand 2b may be referred to as an organic ligand. The reaction inhibitor 202 may be the same as the reaction inhibitor 201 described with reference to FIG. 1B.

Figure 2C:
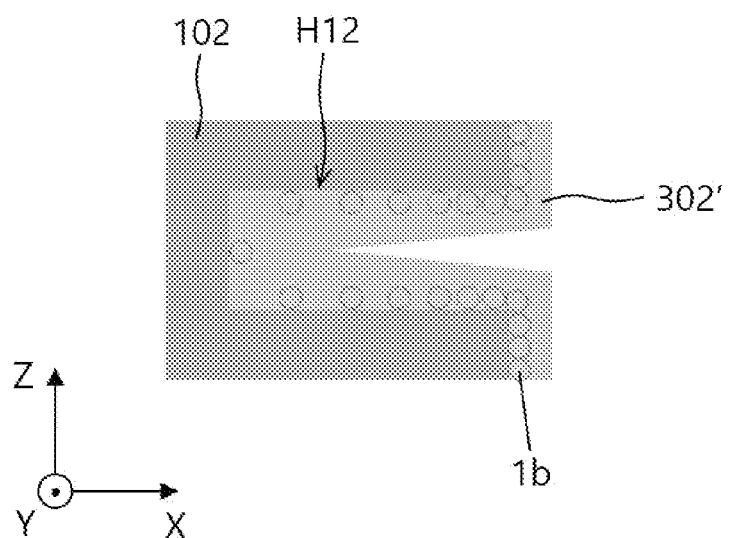
Figure 2D:
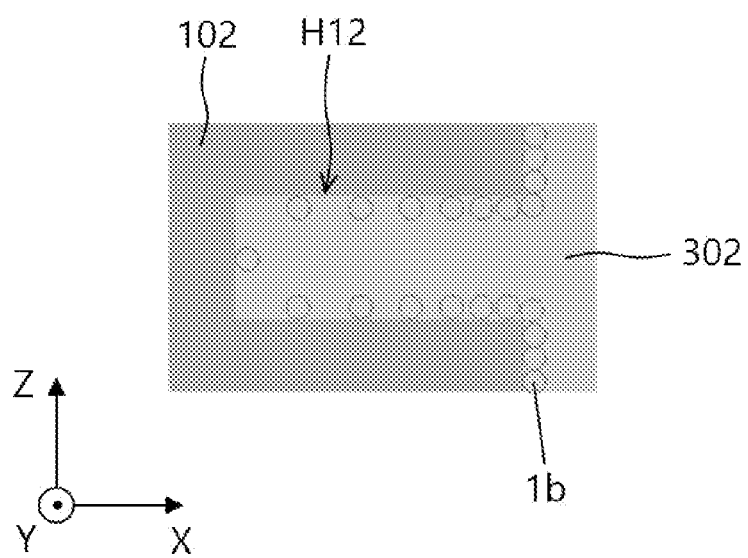

Referring to FIGS. 2C and 2D, the metal layers 302' and 302 may be deposited on the inside and outside of the hole H12 by performing an ALD process. The metal layer 302' shows a metal layer formed in an intermediate stage in which a gap filling process is not completed, and the metal layer 302 shows a metal layer formed in a state in which the gap filling process is substantially completed. Accordingly, the metal layer 302 includes the metal layer 302'.

When depositing the metal layer 302 according to the ALD process, a deposition rate may vary depending on the portions of the hole H12 to which the reaction inhibitor 202 is adsorbed. That is, the deposition rate of the metal layer 302 may vary according to the adsorption density of the reaction inhibitor 202. The deposition rate of the metal layer 302 may be relatively low at the entrance portion of the hole H12 and a first peripheral portion closer to the entrance portion which have a relatively high adsorption density of the reaction inhibitor 202, and the deposition rate of the metal layer 302 may be relatively high at the bottom portion of the hole H12 and a second peripheral portion closer to the bottom portion which have a relatively low adsorption density of the reaction inhibitor 202. Therefore, according to the embodiment of the present disclosure, an overhang phenomenon occurring at the entrance portion of the hole H12 may be prevented, and conformal deposition may be achieved over the entire area of the hole H12. Thus, gap filling characteristics of the metal layer 302 may be improved, and the occurrence of defects such as voids and seams in the metal layer 302 may be prevented.

According to the embodiment of the present disclosure, in the step of depositing the metal layer 302, the metal atoms 1b of the reaction inhibitor 202 may remain on the exposed surface of the substrate structure 102, and all or most of the reaction ligands 2b of the reaction inhibitor 202 may be removed from the substrate structure 102. These characteristics and related effects may be the same as or similar to those described with reference to FIGS. 1B and 1C.

The reaction inhibitor used in the embodiments of the present disclosure may include a material which is adsorbed to a given region of the substrate in the ALD process to inhibit the reaction for thin film deposition. Here, the ALD process may be a process of forming a metal layer.

The reaction inhibitor may include a metal atom and a ligand for reaction inhibition. For example, the reaction inhibitor may include any one of $C_{10}H_{12}M$ (where M represents a metal atom) and $C_9H_8O_3M$ (where M represents a metal atom). That is, the reaction inhibitor may be represented by the formula $C_{10}H_{12}M$ or the formula $C_9H_8O_3M$, where M may represent a metal atom, preferably, a transition metal atom. As non-limiting examples, M may be tungsten (W), titanium (Ti), tantalum (Ta), ruthenium (Ru), molybdenum (Mo), yttrium (Y), vanadium (V), chromium (Cr), copper (Cu), zinc (Zn), niobium (Nb), gold (Au), hafnium (Hf), or the like. Accordingly, $C_{10}H_{12}M$ may be $C_{10}H_{12}W$, $C_{10}H_{12}Ti$, or the like. $C_9H_8O_3M$ may be $C_9H_8O_3W$, $C_9H_8O_3Ti$, or the like. Here, the formula $C_{10}H_{12}W$ may be bis(cyclopentadienyl)tungsten(IV) dihydride, which may be expressed as $Cp_2WH_2$. Here, cyclopentadienyl may perform a function of an excellent inhibitor. Meanwhile, $C_9H_8O_3W$ may be cyclopentadienyl methyl tungsten tricarbonyl, which may be expressed as $CpCH_3W(CO)_3$. Here, methyl may have excellent hydrophobicity.

A thin film formed by the ALD process may be a metal layer, and the metal atom of the reaction inhibitor may be the same as a metal atom of the metal layer or an atom having similar physical properties to the metal atom of the metal layer. For example, when the metal layer is a tungsten (W) layer, the metal atom of the reaction inhibitor may include tungsten (W).

Figure 3:
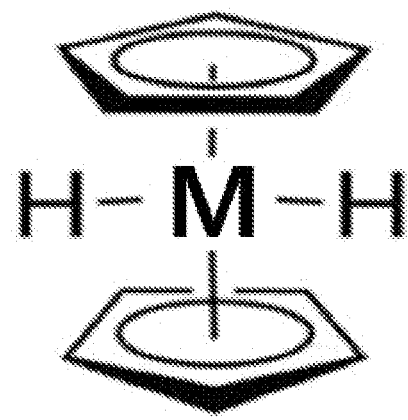
FIG. 3 and FIG. 4 each illustrate a molecular structure of a reaction inhibitor according to an embodiment of the present disclosure.
Figure 4:
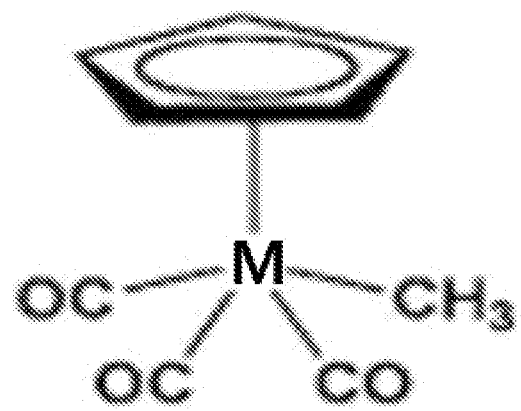

FIG. 3 and FIG. 4 each illustrate a molecular structure of a reaction inhibitor according to an embodiment of the present invention.

FIG. 3 shows a molecular structure of the aforementioned $C_{10}H_{12}M$. M may correspond to a metal atom, and, when M is tungsten, $C_{10}H_{12}M$ may be bis(cyclopentadienyl)tungsten (IV) dihydride. In the molecular structure of FIG. 3, a remaining portion except for M may correspond to a ligand for reaction inhibition.

FIG. 4 shows a molecular structure of the aforementioned $C_9H_8O_3M$. M may correspond to a metal atom, and, when M is tungsten, $C_9H_8O_3M$ may be cyclopentadienyl methyl tungsten tricarbonyl. In the molecular structure of FIG. 4, a remaining portion except for M may correspond to a ligand for reaction inhibition.

However, the specific material structures of the reaction inhibitors disclosed in FIGS. 3 and 4 are exemplary, and the material of the reaction inhibitor applicable to the embodiments of the present disclosure may be variously changed. The reaction inhibitor may also be referred to as a surface protector or a surface treatment agent.

Figure 5:
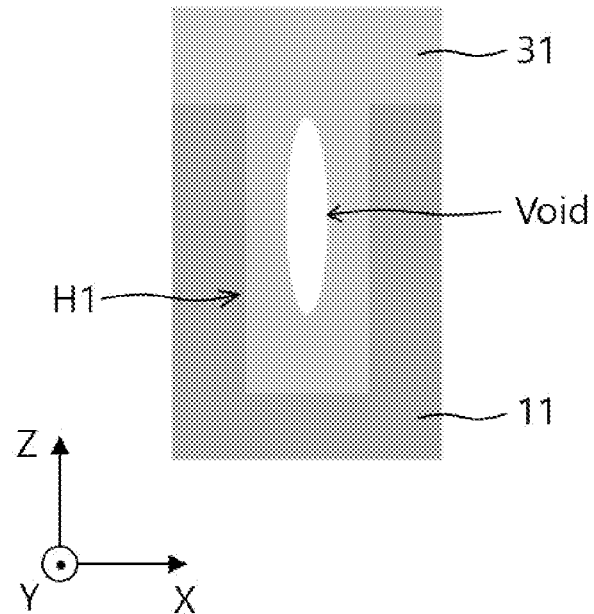
FIG. 5 illustrates a problem of a thin film deposition method according to a first comparative example.

FIG. 5 illustrates a problem of a thin film deposition method according to a first comparative example.

Referring to FIG. 5, a hole H1 having a vertical structure may be formed in a substrate structure 11, and a metal layer 31 may be formed in the hole H1. However, when depositing the metal layer 31 according to the conventional ALD process, since a deposition rate at an entrance portion of the hole H1 is higher than a deposition rate inside the hole H1, defects such as voids or seams may occur in the metal layer 31 due to problems such as overhang.

Figure 6:
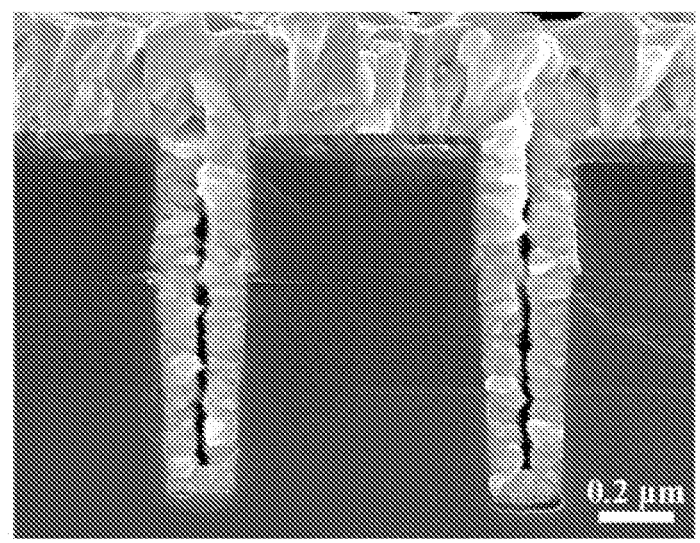
FIG. 6 is a scanning electron microscope (SEM) photographic image illustrating a metal layer deposited according to the first comparative example of FIG. 5.

FIG. 6 is a scanning electron microscope (SEM) photographic image illustrating a metal layer deposited according to the first comparative example of FIG. 5. Referring to FIG. 6, it may be confirmed that the defect such as the void or the seam as described in FIG. 5 is generated in the metal layer.

Figure 7:
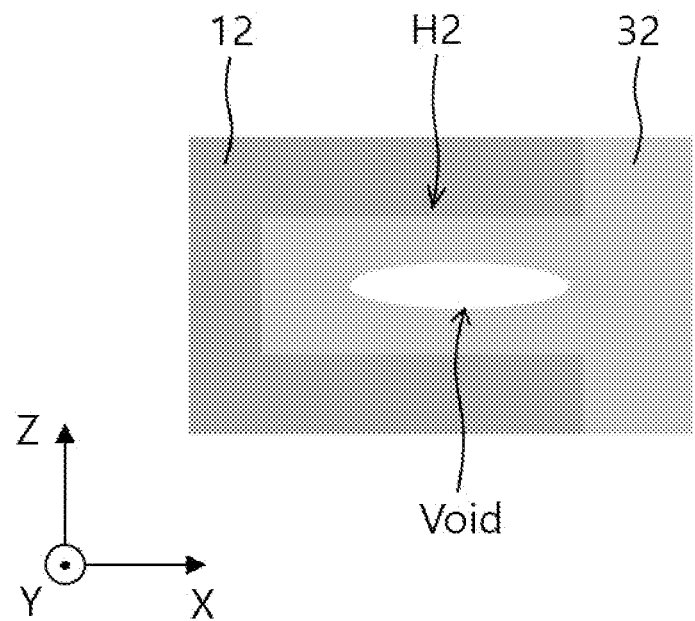
FIG. 7 illustrates a problem of a thin film deposition method according to a second comparative example.

FIG. 7 illustrates a problem of a thin film deposition method according to a second comparative example.

Referring to FIG. 7, a hole H2 having a horizontal structure may be formed in a substrate structure 12, and a metal layer 32 may be formed in the hole H2. During deposition of the metal layer 32, defects such as voids or seams may occur due to problems such as overhang at an entrance portion of the hole H2.

Figure 8:
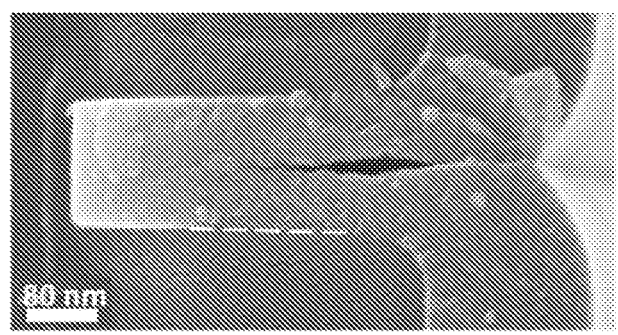
FIG. 8 is an SEM photographic image illustrating a metal layer deposited according to the second comparative example of FIG. 7.

FIG. 8 is an SEM photographic image illustrating a metal layer deposited according to the second comparative example of FIG. 7. Referring to FIG. 8, it may be confirmed that the problem as described in FIG. 7 has occurred in the metal layer.

In addition, when a conventional inhibitor material is used, since the inhibitor material remains in the metal layer and acts like an impurity, the resistance of the metal layer may increase and thus electrical/physical properties of the metal layer may deteriorate.

Figure 9:
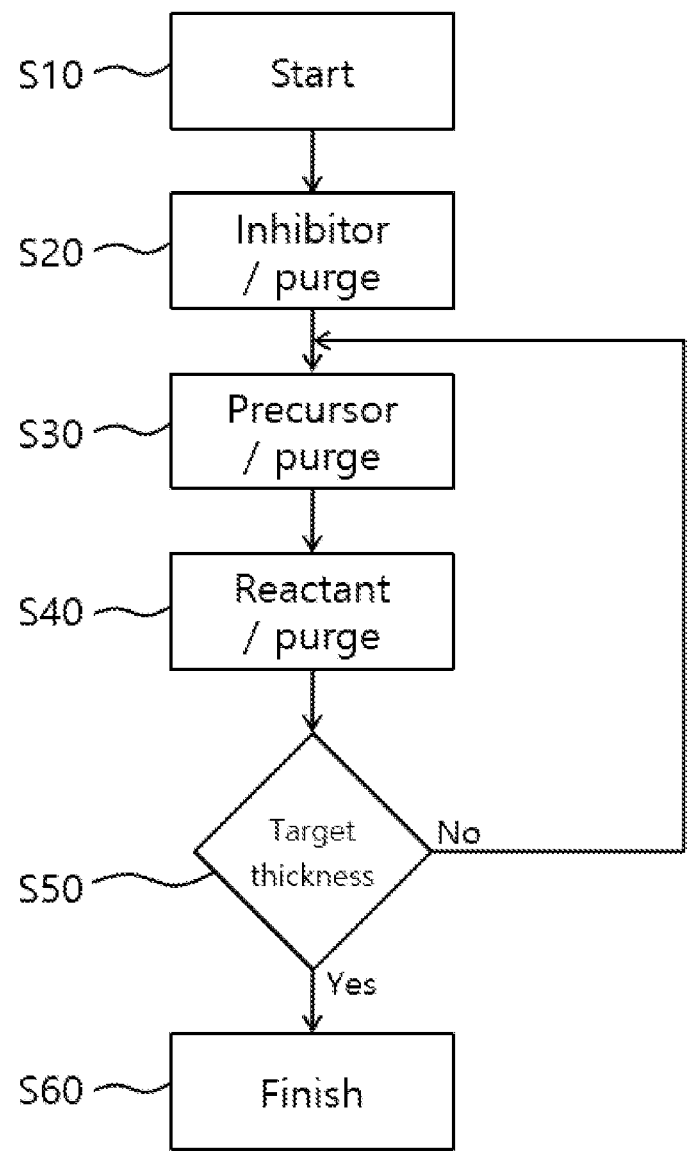
FIG. 9 is a flowchart illustrating a thin film deposition method according to an embodiment of the present disclosure.

FIG. 9 is a flowchart illustrating a thin film deposition method according to an embodiment of the present disclosure.

Referring to FIG. 9, a first step S10 may correspond to a starting step. In the first step S10, a substrate structure having a pattern including a hole may be prepared.

In a second step S20, a reaction inhibitor may be adsorbed to the substrate structure. In this case, the reaction inhibitor may be adsorbed to inside and outside of the hole, i.e., an exposed surface of the substrate structure, and the reaction inhibitor may be adsorbed so that an adsorption density may be lower in the inside of the hole than in the outside of the hole. The adsorption density of the reaction inhibitor may decrease from an entrance portion of the hole and a peripheral portion thereof toward a bottom portion of the hole. The second step S20 may include supplying the reaction inhibitor (e.g., gas including the reaction inhibitor) into a chamber (e.g., a reaction chamber) in which the substrate structure is provided and then purging the chamber.

In a third step S30, a precursor gas including a metal precursor may be supplied into the chamber in which the substrate structure is provided, and then the chamber may be purged. Here, the metal precursor may include a target metal atom and F, Cl, or the like bonded to the target metal atom. The material of the metal precursor may be variously changed according to embodiments.

In a fourth step S40, a reactant gas may be supplied into the chamber, and then the chamber may be purged. The reactant gas may include $H_2$ or $NH_3$. The material of the reactant gas may be variously changed according to embodiments.

The third step S30 and the fourth step S40 may constitute an ALD process for depositing a metal layer. The metal layer may be deposited on the exposed surface of the substrate structure, i.e., on the inside and the outside of the hole by performing the ALD process. When depositing the metal layer, a deposition rate may vary depending on portions of the hole to which the reaction inhibitor is adsorbed, e.g., the entrance portion, the peripheral portion, and the bottom portion of the hole.

After the fourth step S40, it may be determined whether a thickness of the metal layer has reached a target thickness in a fifth step S50. When it is determined that the thickness of the metal layer has not reached the target thickness, the steps S30 and S40 may be sequentially performed again. The steps S30 and S40 may be repeatedly performed until the target thickness is reached.

When it is determined that the thickness of the metal layer has reached the target thickness, the ALD process may be terminated in a sixth step S60.

The steps of the thin film deposition method described with reference to FIG. 9 may be understood in more detail from the description relating to FIGS. 1A to 4.

Figure 10:
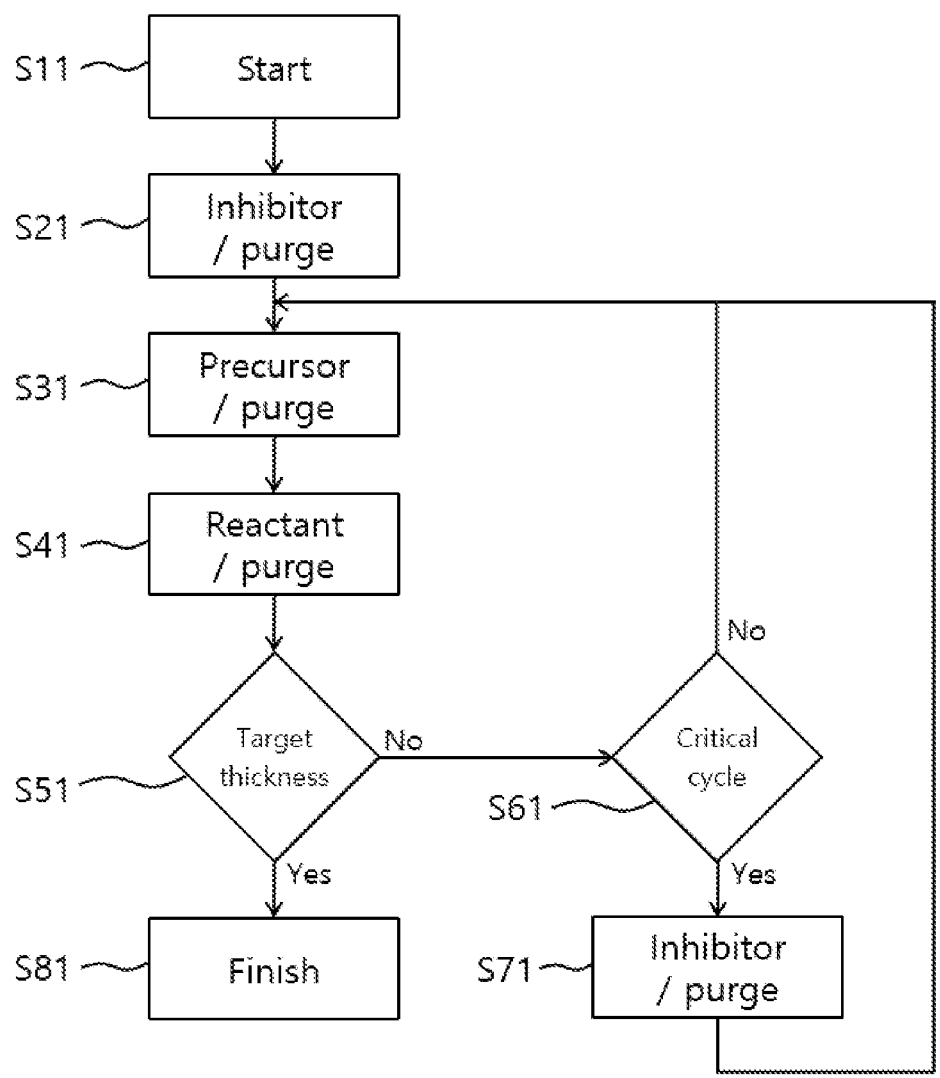
FIG. 10 is a flowchart illustrating a thin film deposition method according to another embodiment of the present disclosure.

FIG. 10 is a flowchart illustrating a thin film deposition method according to another embodiment of the present invention.

Referring to FIG. 10, a first step S11 to a fifth step S51 may be the same as the first step S10 to the fifth step S50 described with reference to FIG. 9, respectively.

In the first step S11, a substrate structure having a pattern including a hole may be prepared. In the second step S21, a reaction inhibitor (hereinafter, a first reaction inhibitor) may be adsorbed onto the substrate structure. The second step S21 may include supplying the first reaction inhibitor (e.g., gas including the first reaction inhibitor) into a chamber in which the substrate structure is provided and purging the chamber.

In the third step S31, a precursor gas including a metal precursor may be supplied into the chamber in which the substrate structure is provided, and then the chamber may be purged. In the fourth step S41, a reactant gas may be supplied into the chamber, and then the chamber may be purged. The third step S31 and the fourth step S41 may constitute an ALD process for depositing a metal layer.

In the fifth step S51, it may be determined whether a thickness of the metal layer has reached a target thickness. When it is determined that the thickness of the metal layer has not reached the target thickness, it may be determined whether the ALD process has reached a critical cycle in a sixth step S61. Whether the critical cycle has been reached or not may be determined according to whether the reaction inhibitory function of the first reaction inhibitor formed in an initial stage is eliminated or not. When the reaction inhibitory function of the first reaction inhibitor is eliminated, it is determined that the ALD process has reached the critical cycle.

When it is determined in the sixth step S61 that the ALD process has not reached the critical cycle, the steps S31 and S41 may be sequentially performed again. When it is determined that the ALD process has reached the critical cycle, a second reaction inhibitor may be adsorbed onto the substrate structure in a seventh step S71. The seventh step S71 may include supplying the second reaction inhibitor (e.g., gas including the second reaction inhibitor) into the chamber in which the substrate structure is provided and purging the chamber. The second reaction inhibitor may include the same material as the first reaction inhibitor.

Accordingly, the thin film deposition method according to the present embodiment may further include the step for adsorbing the second reaction inhibitor onto the substrate structure one or more times while depositing the metal layer.

In another embodiment, the step for depositing the metal layer may include depositing a first metal layer and depositing a second metal layer on the first metal layer, and the thin film deposition method may further include adsorbing the second reaction inhibitor on the first metal layer between depositing the first metal layer and depositing the second metal layer.

When it is determined that the reaction inhibitory function of the first reaction inhibitor formed in the initial stage is eliminated, the reaction inhibitory function may be restored by supplying the second reaction inhibitor. Similarly to the first reaction inhibitor, the second reaction inhibitor may also be adsorbed onto the substrate structure to have a lower adsorption density inside the hole than outside the hole. The adsorption density of the second reaction inhibitor may decrease from the entrance portion of the hole and the peripheral portion thereof toward the bottom portion of the hole. As the reaction inhibition function is restored by the adsorption of the second reaction inhibitor, gap filling characteristics of the metal layer may be improved when the metal layer is deposited by the ALD process. However, additional adsorption of the second reaction inhibitor may be optionally determined, if necessary. Therefore, the adsorption of the second reaction inhibitor may be omitted according to an embodiment.

When it is determined that the thickness of the metal layer has reached the target thickness in the fifth step S51, the ALD process according to the embodiment may be terminated in an eighth step S81.

Figure 11A:
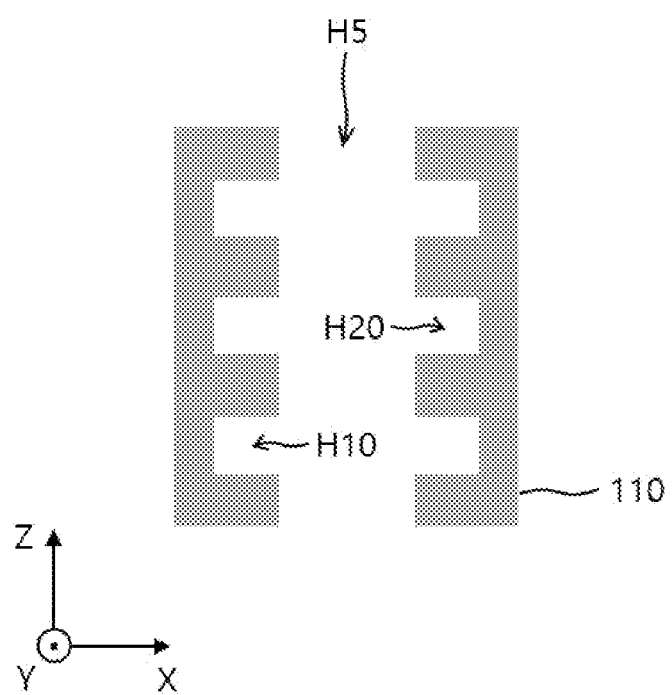
FIG. 11A and FIG. 11B are cross-sectional diagrams illustrating a thin film deposition method according to another embodiment of the present disclosure.
Figure 11B:
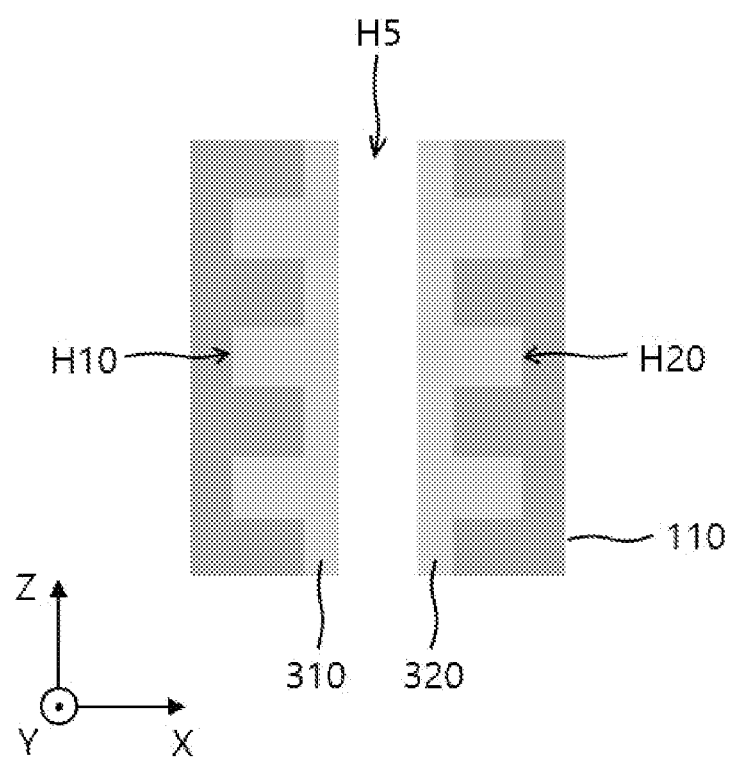

FIG. 11A and FIG. 11B are cross-sectional diagrams illustrating a thin film deposition method according to another embodiment of the present disclosure.

Referring to FIG. 11A, a substrate structure 110 having a predetermined pattern may be provided. The substrate structure 110 may include an opening region H5 formed in a vertical direction substantially perpendicular to a top surface of a substrate. The substrate structure 110 may also include a plurality of first holes H10 formed to extend in a horizontal direction along a first side surface exposed by the opening region H5. The horizontal direction may be substantially parallel to the top surface of the substrate. The plurality of first holes H10 may be disposed to be spaced apart from each other in the vertical direction. Also, the substrate structure 110 may include a plurality of second holes H20 formed to extend in the horizontal direction along a second side surface exposed by the opening region H5. The plurality of second holes H20 may be disposed to be spaced apart from each other in the vertical direction. The second side surface may be a surface facing the first side surface in the opening region H5. The plurality of second holes H20 may be disposed to correspond to the plurality of first holes H10, respectively. Such a substrate structure 110 may be said to have a three-dimensional pattern structure.

Referring to FIG. 11B, a first metal layer 310 may be deposited on the first side surface to fill the plurality of first holes H10, and a second metal layer 320 may be deposited on the second side surface to fill the plurality of second holes H20. The deposition of the first and the second metal layers 310 and 320 may be simultaneously performed according to the thin film deposition method according to the embodiment described with reference to FIGS. 1A to 4, and any of FIGS. 9 and 10. Therefore, excellent gap filling characteristics may be secured even for the substrate structure 110 having the three-dimensional pattern structure, and electrical/physical characteristics of the deposited metal layers 310 and 320 may also be excellent.

The thin film deposition method according to the embodiments described with reference to FIGS. 1A to 4 and 9 to 11B may be usefully applied to various electronic device fabricating methods. A method of fabricating an electronic device according to an embodiment of the present disclosure may include preparing a substrate structure having a pattern including a hole and depositing a metal layer on the substrate structure by using the thin film deposition method according to any of the above-described embodiments. In particular, the above-described thin film deposition method may be utilized in fabricating a three-dimensional V-NAND device using a three-dimensional pattern structure.

Figure 12A:
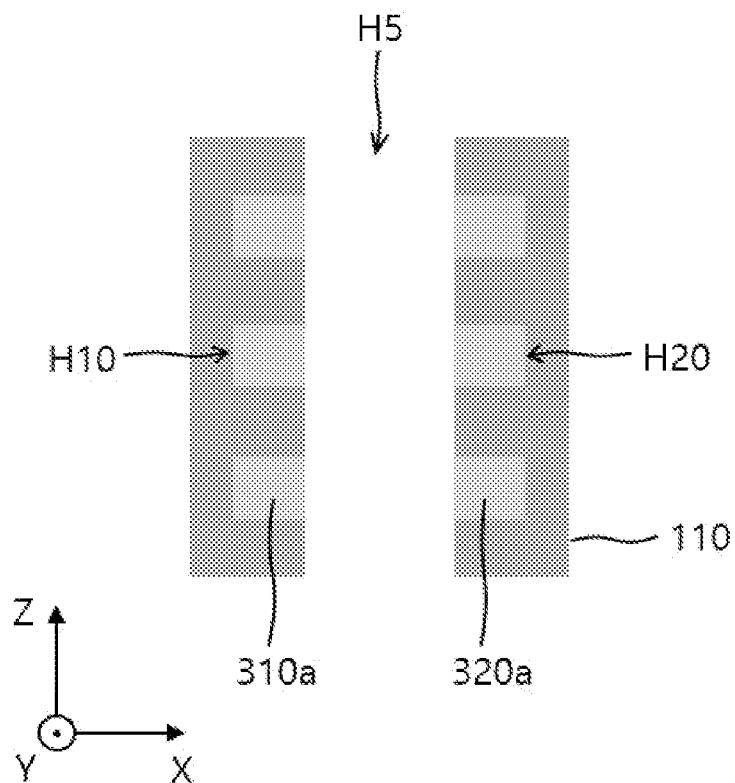
FIG. 12A and FIG. 12B are cross-sectional diagrams illustrating a method of fabricating an electronic device according to an embodiment of the present disclosure.
Figure 12B:
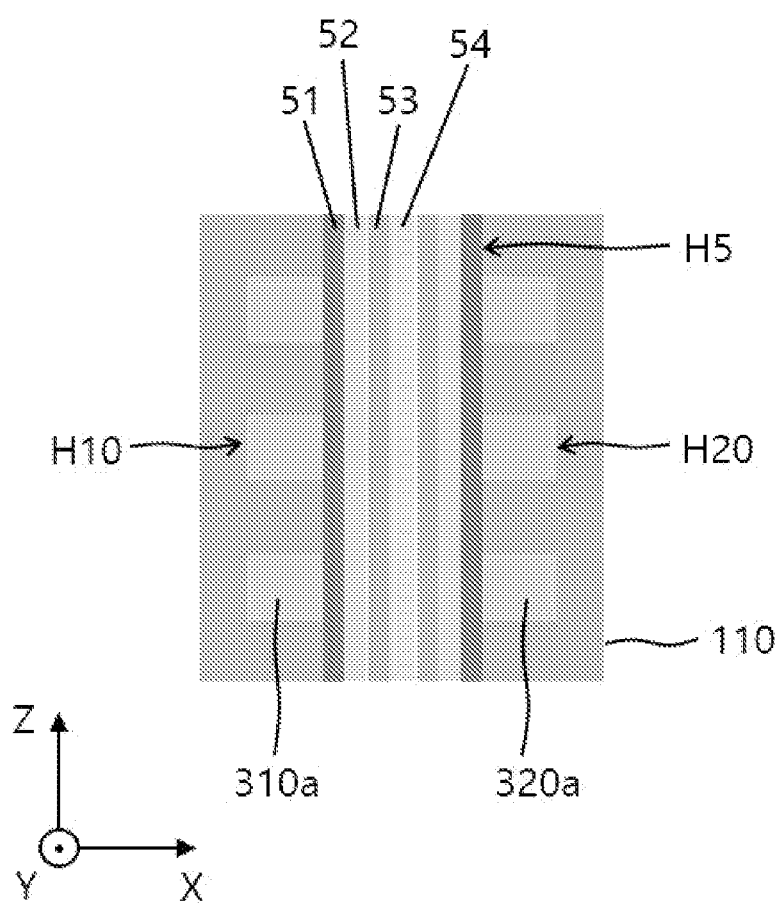

FIG. 12A and FIG. 12B are cross-sectional diagrams illustrating a method of fabricating an electronic device according to an embodiment of the present disclosure. Here, the electronic device may be a three-dimensional V-NAND device.

Referring to FIG. 12A, after the structure shown in FIG. 11B is manufactured, the first metal layer 310 and the second metal layer 320 may be partially etched. For example, a patterned first metal layer 310a may remain only inside the plurality of first holes H10 by removing a portion of the first metal layer 310 that exists outside the plurality of first holes H10. Similarly, a patterned second metal layer 320a may remain only inside the plurality of second holes H20 by removing a portion of the second metal layer 320 that exists outside the plurality of second holes H20. Hereinafter, the patterned first metal layer 310a may be a control gate serving as a first gate electrode 310a. Similarly, the patterned second metal layer 320a may be a control gate serving as a second gate electrode 320a.

Referring to FIG. 12B, a gate insulating layer (also referred to as a blocking insulating layer) 51, a charge storage layer 52, a tunnel insulating layer 53, and a channel layer 54 may be formed in the opening region H5. The gate insulating layer 51, the charge storage layer 52, the tunnel insulating layer 53, and the channel layer 54 may be sequentially disposed from a side of the first gate electrode 310a. Similarly, from a side of the second gate electrode 320a, the gate insulating layer (or also referred to as the blocking insulating layer) 51, the charge storage layer 52, the tunnel insulating layer 53, and the channel layer 54 may be sequentially arranged. That is, the gate insulating layer 51, the charge storage layer 52, the tunnel insulating layer 53, and the channel layer 54 may be sequentially deposited to fill the opening region H5.

However, the structure of the electronic device (i.e., the three-dimensional V-NAND device) shown in FIG. 12B is merely exemplary. Embodiments are not limited to the structure.

The embodiments described above may overcome the limitations and problems of the conventional thin film deposition method, and effectively suppress the occurrence of defects such as voids or seams in a thin film deposited on a substrate structure having a predetermined pattern. In addition, it is possible to secure excellent physical properties of the deposited thin film. The thin film deposition method according to the embodiments may be usefully applied to the manufacturing of various electronic devices. In addition, since the reaction inhibitor according to the embodiments may include the same material as the target material to be deposited, it is possible to prevent deterioration of the physical properties of the deposited thin film and advantageously act in securing excellent properties of the deposited thin film.

In the present specification, the preferred embodiments of the present invention have been disclosed, and although specific terms are used, these are only used in a general sense to easily describe the technological contents of the present invention and to help the understanding of the present invention, and are not used to limit the scope of the present invention. It will be apparent to those of ordinary skill in the art to which the present invention pertains that other modifications based on the technological spirit of the present invention may be implemented in addition to the embodiments disclosed herein. It will be appreciated to those of ordinary skill in the art that a thin film deposition method, a reaction inhibitor used in the thin film deposition method, and a fabricating method of electronic devices to which the thin film deposition method is applied according to the embodiments described with reference to FIGS. 1A to 4 and 9 to 12B may be variously substituted, changed, and modified without departing from the spirit of the present invention. Therefore, the scope of the invention should not be determined by the described embodiments, but should be determined by the technological concepts described in the claims.

What is claimed is:

1. A thin film deposition method, comprising:
preparing a substrate structure including a hole;
adsorbing a reaction inhibitor to inside and outside of the hole in the substrate structure, wherein an adsorption density of the reaction inhibitor is lower in the inside of the hole than in the outside of the hole; and
depositing a metal layer on the inside and the outside of the hole by performing an atomic layer deposition (ALD) process, wherein a deposition rate of the metal layer varies depending on portions of the hole to which the reaction inhibitor is adsorbed,
wherein the reaction inhibitor includes a metal atom and a ligand for reaction inhibition, the ligand being bonded to the metal atom, and the metal atom remains on the substrate structure in the depositing of the metal layer;
wherein the reaction inhibitor is a first reaction inhibitor, and
the depositing of the metal layer includes depositing a first metal layer on the inside and the outside of the hole and depositing a second metal layer on the first metal layer, and
wherein the thin film deposition method further comprises adsorbing a second reaction inhibitor one or more times onto the first metal layer between the depositing the first metal layer and the depositing the second metal layer.

2. The thin film deposition method of claim 1, wherein the metal atom of the reaction inhibitor is the same as a metal atom of the metal layer.

3. The thin film deposition method of claim 1, wherein the adsorption density of the reaction inhibitor decreases from an inlet portion of the hole toward a bottom portion of the hole.

4. The thin film deposition method of claim 1, wherein the reaction inhibitor includes any one of $C_{10}H_{12}M$ and $C_9H_8O_3M$, M representing a metal atom.

5. The thin film deposition method of claim 4, wherein the $C_{10}H_{12}M$ is $C_{10}H_{12}W$ or $C_{10}H_{12}Ti$.

6. The thin film deposition method of claim 4, wherein the $C_9H_8O_3M$ is $C_9H_8O_3W$ or $C_9H_8O_3Ti$.

7. The thin film deposition method of claim 1, wherein the second reaction inhibitor includes the same material as the first reaction inhibitor.

8. The thin film deposition method of claim 1, wherein the depositing of the metal layer includes:
supplying a precursor gas including a metal precursor into a chamber in which the substrate structure is provided;
purging the chamber;
supplying a reactant gas into the chamber; and
purging the chamber.

9. The thin film deposition method of claim 1, wherein the hole has a vertical hole structure extending in a direction perpendicular to a top surface of a substrate.

10. The thin film deposition method of claim 1, wherein the hole has a horizontal hole structure extending in a first direction parallel to a top surface of a substrate.

11. The thin film deposition method of claim 10, wherein the hole includes an opening region, a plurality of first holes, and a plurality of second holes, wherein the opening region extends in a second direction perpendicular to the top surface of the substrate, wherein the plurality of first holes extend in the first direction along a first side surface of the opening region and are formed to be spaced apart from each other in the second direction, wherein the plurality of second holes extend in the first direction along a second side surface of the opening region that faces the first side surface, and are formed to be spaced apart from each other in the second direction, and wherein the metal layer is deposited in the plurality of first holes and the plurality of second holes.

* * * * *